(12) United States Patent
Eichner et al.

(10) Patent No.: US 11,617,271 B2
(45) Date of Patent: Mar. 28, 2023

(54) CIRCUIT ARRANGEMENT, IN PARTICULAR FOR AN ELECTRICALLY DRIVEN MOTOR VEHICLE

(71) Applicant: VALEO SIEMENS EAUTOMOTIVE GERMANY GMBH, Erlangen (DE)

(72) Inventors: Markus Eichner, Nuremberg (DE); Christoph Heumann, Nuremberg (DE); Christoph Hoyler, Kirchensittenbach (DE); Alex Mueller, Nuremberg (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 1062 days.

(21) Appl. No.: 16/328,451

(22) PCT Filed: Aug. 31, 2017

(86) PCT No.: PCT/EP2017/071906
§ 371 (c)(1),
(2) Date: Mar. 19, 2019

(87) PCT Pub. No.: WO2018/041970
PCT Pub. Date: Mar. 8, 2018

(65) Prior Publication Data
US 2021/0282271 A1 Sep. 9, 2021

(30) Foreign Application Priority Data
Sep. 1, 2016 (DE) ...................... 10 2016 216 507.0

(51) Int. Cl.
*H05K 3/32* (2006.01)
*H01R 12/70* (2011.01)
(Continued)

(52) U.S. Cl.
CPC .............. *H05K 3/326* (2013.01); *B60L 50/40* (2019.02); *H01R 12/7064* (2013.01);
(Continued)

(58) Field of Classification Search
CPC ............ H01R 12/7064; H01R 13/4223; H05K 3/326; H05K 2201/10272; H05K 2201/1059
See application file for complete search history.

(56) References Cited

U.S. PATENT DOCUMENTS 6,024,589 A 2/2000 Hahn, IV et al.
8,446,733 B2 * 5/2013 Hampo .................. H01R 12/71
361/775
(Continued)

FOREIGN PATENT DOCUMENTS

DE 60 2004 002 729 T2 8/2007
DE 10 2011 011 017 A1 8/2012
(Continued)

OTHER PUBLICATIONS

PCT/ISA/210, "International Search Report for International Application No. PCT/EP2017/071906", dated Nov. 29, 2017.

*Primary Examiner* — Briggitte R. Hammond
(74) *Attorney, Agent, or Firm* — Manabu Kanesaka

(57) ABSTRACT

A circuit arrangement (1), in particular for an electrically driven motor vehicle, has at least one bus bar (5) which is connected electrically to a supplier (2) and which is connected to a first consumer (3) at a first transfer point (6) and to a second consumer (4) at a second transfer point (7). Both the first and the second transfer point (6, 7) are formed as flexible contact points.

6 Claims, 2 Drawing Sheets

Figure 1:
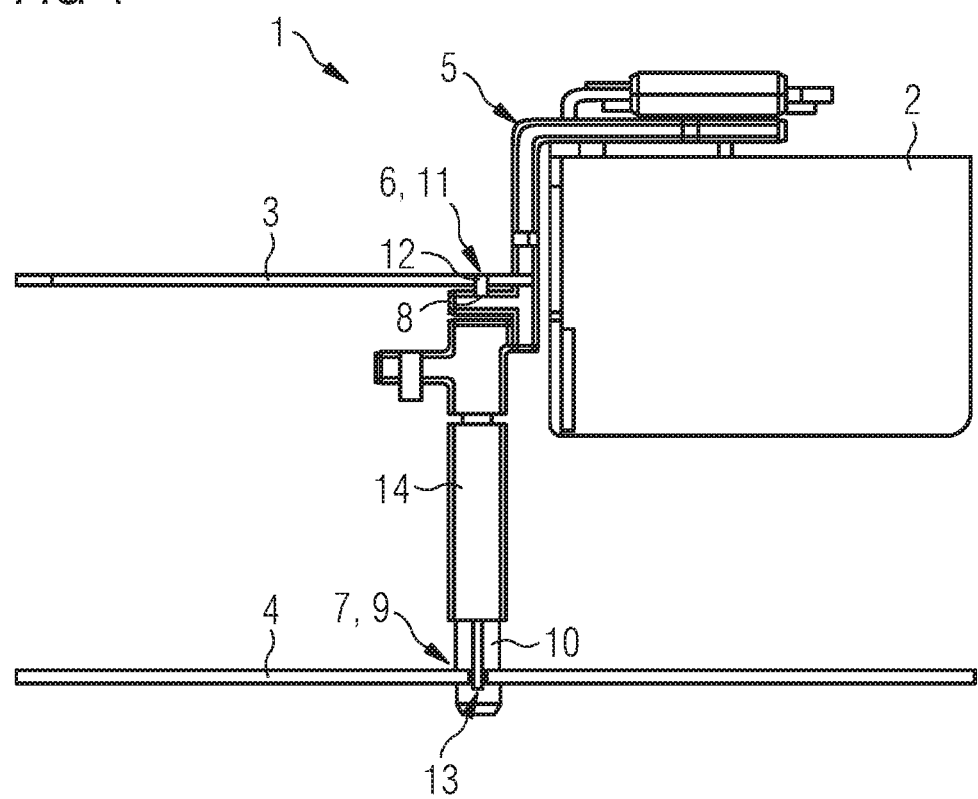

(51) Int. Cl.
*H01R 13/422* (2006.01)
*B60L 50/40* (2019.01)
*H05K 7/10* (2006.01)

(52) U.S. Cl.
CPC ....... *H01R 13/4223* (2013.01); *H05K 7/1069* (2013.01); *H01R 2201/26* (2013.01); *H05K 2201/1059* (2013.01); *H05K 2201/10272* (2013.01)

(56) References Cited

U.S. PATENT DOCUMENTS

| | | |
|---|---|---|
| 2011/0235348 A1 | 9/2011 | Tateishi et al. |
| 2014/0030556 A1 | 1/2014 | Beer |

FOREIGN PATENT DOCUMENTS

| | | |
|---|---|---|
| DE | 10 2012 201 754 A1 | 8/2013 |
| EP | 0 501 171 A2 | 9/1992 |
| EP | 2 112 717 A2 | 10/2009 |
| WO | 2010/002156 A2 | 1/2010 |

\* cited by examiner

CIRCUIT ARRANGEMENT, IN PARTICULAR FOR AN ELECTRICALLY DRIVEN MOTOR VEHICLE

The invention relates to a circuit arrangement, in particular for an electrically driven motor vehicle.

Typically rigid bus bars are used in circuit arrangements for electrically driven motor vehicles for conducting an electrical current from a supplier to a consumer. In known consumers, for example those embodied as converters, the electrical contacting for the consumer is accomplished using solder or weld connections or using screw contacts.

The use of such rigid connecting technologies is problematic in cases in which a plurality of components or consumers must be electrically contacted. To maintain component-dependent tolerances, therefore, a discrete bus bar or a discrete pair of bus bars is provided for each consumer. When there is a large number of consumers to be connected, this approach involves a significant number of components, which leads to increased production costs.

The object of the invention is to provide a circuit arrangement that satisfies requirements for component tolerances to be maintained in a manner that may be realized cost-effectively for serial production.

This object is attained using a circuit arrangement having the additional features of patent claim 1.

Advantageous refinements of the invention are the subject matter of the subordinate claims.

A circuit arrangement, in particular for an electrically driven motor vehicle, has at least one bus bar which is electrically connected to a supplier and which is electrically connected to a first consumer at a first transfer point and to a second consumer at a second transfer point. The first transfer point and the second transfer point are formed as flexible contact points.

Thus multicontacting of the bus bar is suggested such that an electrical current may be supplied to a plurality of consumers. As a result, fewer components are required for supplying electricity so that per unit costs may be reduced. As well, the required tolerances are assured in that no rigid types of connections are used, in particular no soldered, welded, or screw connections are used, for electrically conducting contacting. On the contrary, the contact point is flexible, that is, it is formed, at least in part, from elements that are elastic or bendable such that even a slight movement of bus bar and consumer at the first and/or second transfer point, for example in the context of vibrations and/or shocks due to operation, may be compensated. The permits, first of all, compensation of structurally imposed tolerances, in particular different tolerances, at the first and/or second transfer point while simultaneously using bus bars that are per se rigid. Secondly, the circuit arrangement embodied shock resistant or jolt resistant is particularly suitable for use in electrically driven motor vehicles.

Electrically driven motor vehicles refers to motor vehicles that have at least one electrical drive embodied for driving the motor vehicle. This definition includes in particular so-called hybrid vehicles in which an internal combustion engine is typically provided in addition to the electrical drive.

In a refinement of the invention, a plurality of consumers, that is, more than two consumers, are electrically connected via a bus bar to a number of transfer points corresponding to the number of consumers. Each of the transfer points is formed as a flexible contact point.

The electrically conducting connection is preferably formed at the flexible contact points by means of a force-fit and/or positive-fit connection.

In possible exemplary embodiments, the flexible contact points are formed as press-in contacts and/or spring contacts. Spring contacts may comprise in particular spring contact elements that are resiliently prestressed towards a contact surface that is arranged on a printed circuit board of the first and/or second consumer or on the bus bar. The electrical contacting is thus accomplished by means of a force fit.

Known press-in connections in general have pin-shaped contact parts with deformation zones. For contacting, the contact part is pressed into another, complementary contact part such that a force-fit and positive-fit electrically conducting connection is formed in the region of the deformation zone. The force to be exerted for this is typically several 100 N.

In one possible exemplary embodiment of the invention, at least one of the flexible contact points is formed as a press-in contact that has fork-like contact elements that project from the end of the bus bar and are pressed into a rigid contact bushing of the first and/or second consumer in a force fit. The fork-like contact elements are flexible and may thus compensate component tolerances and jolting or vibrations.

The fork-like contact elements are particularly preferably flexible such that the force-fit between the fork-like contact elements and the electrically conducting contact bushing may be generated by a press-in force that is less than 100 N, in particular about 30 N to 50 N. In other words, the electrical contacting of the first and/or second consumer may be accomplished with an exertion of force that is clearly less than that used in current press-in techniques.

With spring contacts, the contact element providing the electrically conducting connection is prestressed by a separate spring, for example. In other exemplary embodiments, the contact element itself is formed as a spring contact element and thus has at least one resilient section.

The first and/or second consumer preferably comprises an interconnect device, in particular a printed circuit board having electronic components arranged thereon and interconnected with one another. In one possible exemplary embodiment, the first and/or second consumer implements a control logic for a power electronics element of the motor vehicle.

In the context of the present specification, the supplier is an element or component that can function as an energy source, at least at times. This definition thus includes conventional sources of current or voltage, such as in particular batteries, but also energy buffers that may be provided, for example, by a capacitor or a plurality of capacitors, in particular a plurality of capacitors switched in parallel.

In one possible exemplary embodiment, the circuit arrangement is part of a control electronics element for a power converter, for example for a frequency converter in an electric motor. Such circuit arrangements are supplied power, for instance, by a direct current intermediate circuit to which power semiconductor modules for the electric motor are also attached. The electric motor is preferably embodied as a drive assembly of an electrically operated motor vehicle. In this case the direct current intermediate circuit is typically supplied power directly from a battery. The direct current intermediate circuit has a capacitor or a plurality of interconnected capacitors, normally called intermediate circuit capacitors, and thus acts as an energy buffer for a downstream power converter, in particular for a downstream power inverter. The first and/or second consumer may also be embodied, for example, as a d.c.c. converter that is supplied power by the intermediate circuit capacitor and draws its power input, of in particular multiple kilowatts, therefrom.

Refer to the exemplary embodiment illustrated in the drawings for further description of the invention.

Figure 2:
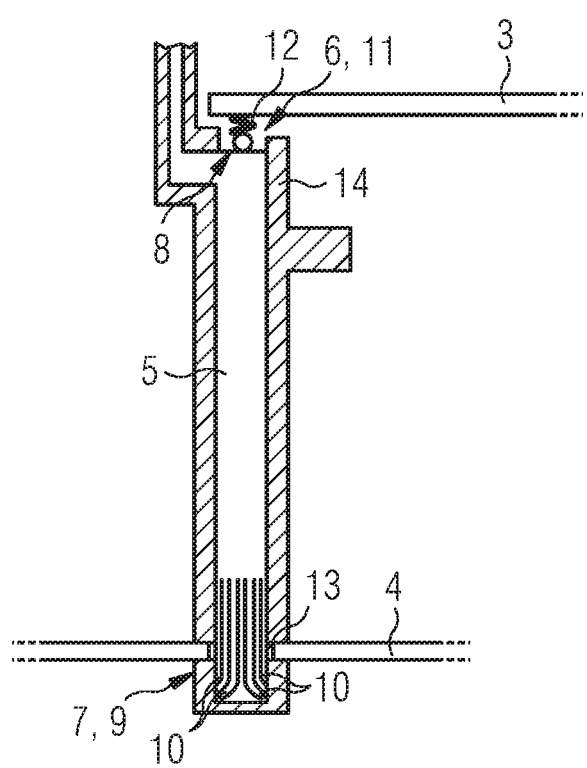

FIG. 1 provides in a schematic side view of a circuit arrangement having a plurality of contacted bus bars, and, FIG. 2 provides a schematic sectional view with details of the electrical contacting of the bus bars at a first transfer point and a second transfer point.

Equivalent parts are provided with the same reference numbers in all of the figures.

FIG. 1 illustrates the schematic structure of a circuit arrangement 1 that executes, for example, the function of a control module for a power converter with integrated direct current converter. A supplier 2 comprises a battery-supplied direct current intermediate circuit having an intermediate circuit capacitor that provides an energy storage unit for a plurality of electrical networks coupled thereto. The supplier 2 is connected to first and second consumers 3, 4 via two rigid bus bars 5 that are guided, parallel to one another, in a housing 14. In a manner not depicted in greater detail, the first and second consumers 3, 4 comprise a plurality of electronic components arranged on printed circuit boards to which an electrical current may be supplied via the bus bar 5. The first consumer 3 here is an electronic control for a power inverter of an electric motor provided in the drive train of a motor vehicle. The second consumer 4 is a d.c.-d.c. current converter. The bus bars 5 are in electrically conducting contact with the first consumer at first transfer points 6. Correspondingly, the second consumer 4 is in electrically conducting contact at second transfer points 7. Each bus bar therefore has two transfer points 6, 7 for contacting the first and second consumers 3, 4. FIG. 2 illustrates details of the electrical contacting of the bus bar 5 in the region of the first and second transfer points 6, 7.

Both the first and the second transfer points 6, 7 are formed as flexible contact points. At the first transfer point 6, the flexible contact point is realized by a spring contact 11, a butt contact being formed in that a spring contact element 12 reaches through a recess in the housing 14 and contacts a contact surface 8 on the bus bar 5. The spring contact element 12 is provided on the printed circuit board of the first consumer 3 and is resiliently prestressed towards the contact surface 8. The electrically conducting connection in this case is assured by a force fit between the contact element 12 and the contact surface 8.

The second consumer 4 is connected to the bus bars 5 in an electrically conducting manner via press contacts 9. As depicted in FIG. 2, a sleeve-shaped contact bushing 13 having an electrically conducting inner surface, which is contacted in a force fit and in a positive fit by fork-like contact elements 10, is added to the printed circuit board of the second consumer 4. The fork-like contact elements 10 are flexible and resilient such that, for one thing, operation-related vibrations and component tolerances may be compensated. In addition, the force required to press the contact elements 10 into the contact bushing 13 is significantly less than that required for conventional press-in contacts, in which there is at least some plastic deformation of the contact part during the pressing-in process.

Although the preferred exemplary embodiment of the invention has been illustrated and described in detail, the invention is not limited thereby. The person skilled in the art may derive other variations and combinations without departing from essential ideas of the invention.

The invention claimed is:

1. A circuit for an electrically driven motor vehicle, comprising:
   at least one bus bar which is electrically connected to a supplier, and
   a first consumer connected to the at least one bus bar at a first transfer point and a second consumer connected to the at least one bus bar at a second transfer point, the first and second transfer points being formed as flexible contact points,
   wherein one of the flexible contact points includes a sleeve-shaped contact bushing having an electrically conducting inner surface with a press-in contact, the press-in contact having fork-shape contact elements that project from an end of the at least one bus bar and are pressed to contact with the contact bushing of one of the first and second consumers.

2. The circuit according to claim 1, wherein the fork-shape contact elements are flexible such that force-fit between the fork-shape contact elements and the contact bushing is produced by a pressing-in force that is less than 100 N.

3. The circuit according to claim 1, wherein another of the flexible contact points is embodied as a spring contact.

4. The circuit according to claim 1, wherein, the first and/or second consumer comprises an interconnect device having electronic components arranged thereon and interconnected with one another.

5. The circuit according to claim 1, wherein the supplier comprises a capacitor of a direct current intermediate circuit.

6. The circuit according to claim 1, further comprising a housing covering the at least one bus bar except for the first and second contact points.

* * * * *